United States Patent [19]
Harris et al.

[11] Patent Number: 5,325,318
[45] Date of Patent: Jun. 28, 1994

[54] VARIABLE RATE DIGITAL FILTER

[75] Inventors: Fredric J. Harris, Lemon Grove; Shimon Tzukerman, San Diego; James N. Esserman, San Diego; Itzhak Gurantz, San Diego, all of Calif.

[73] Assignee: Constream Corporation, San Diego, Calif.

[21] Appl. No.: 106,189

[22] Filed: Aug. 12, 1993

Related U.S. Application Data

[63] Continuation of Ser. No. 829,803, Jan. 31, 1992, abandoned.

[51] Int. Cl.$^5$ .............................................. G06F 15/31
[52] U.S. Cl. ............................. 364/724.1; 364/724.17
[58] Field of Search ............ 364/724.01, 724.1, 724.17

[56] References Cited

U.S. PATENT DOCUMENTS

| | | | |
|---|---|---|---|
| 4,794,556 | 12/1988 | Rader | 364/724.17 |
| 4,908,787 | 3/1990 | Dyer | 364/724.1 |
| 4,970,637 | 11/1990 | Sato | 364/724.01 |
| 5,010,507 | 4/1991 | Kenny | 364/724.01 |
| 5,138,569 | 8/1992 | Valenzuela | 364/724.1 |

OTHER PUBLICATIONS

Bellanger et al., "Interpolation, extrapolation, and reduction of computation speed in digital filters," *IEEE Trans. Acoust., Speech, Signal Processing*, vol. ASSP-22, pp. 231-235, Aug. 1974.

R. R. Shively, "On multistage FIR filters with decimation," *IEEE Trans. Acoust., Speech, Signal Processing*, vol. ASSP-23, pp. 353-357, Aug. 1975.

R. E. Crochiere and L. R. Rabiner, "Optimum FIR digital filter implementations for decimation, interpolation, and narrow-band filtering," *IEEE Trans. Acoust., Speech, Signal Processing*, vol. ASSP-23, pp. 444-456, Oct. 1975.

P. A. Regaila, et al., "The digital all-pass filter: a versatile signal processing building block," *Proc. IEEE*, vol. 76, No. 1, Jan. 1988.

*Primary Examiner*—David H. Malzahn
*Attorney, Agent, or Firm*—Townsend and Townsend Khourie and Crew

[57] ABSTRACT

A variable digital filter employs a variable rate sample clock with combinations of various digital filter elements such as an efficient implementation of decimation to achieve various filter realizations allowing a selectable output bandwidth. More specifically, a digital filter apparatus is coupled to receive input analog signals from a fixed anti-aliasing analog filter and optionally includes one or several stages of digital decimation filters, a low-pass filter, an optional equalizer, and an optional high-pass filter each of which may be programmed so as to configure the device with a variety of transfer characteristics. The filter device employs an input sample clock in the range of F-K*F, where, in a specific embodiment K is selected to be 2. The selectable combination of elements and stages used to form the filter needed is operative at a broad range of sample rates over a predetermined bandwidth range without loss of resolution. An extremely simple digital filter with a bandwidth of ¼ the input sample rate is also shown.

19 Claims, 5 Drawing Sheets

VARIABLE RATE DIGITAL FILTER

This is a continuation of application Ser. No. 07/829,803, filed Jan. 31, 1992, now abandoned.

BACKGROUND OF THE INVENTION

This invention relates to devices for performing filtering functions on signals using digital filtering techniques, and, more particularly, to a digital filter capable of operating with consistency over a wide range of cutoff frequencies and spectral shapes.

In many signal processing areas, a filter whose cutoff frequency and rolloff characteristics can be programmed with high resolution is desired. Common filtering tasks in communication systems include the minimizing of Inter-Symbol Interference (ISI) using Nyquist filters, the use of a matched filter (a filter with characteristics matched or complementary to characteristics of the signal applied to the communication channel) at the receiving end of a channel to maximize the receiver signal-to-noise ratio (SNR), and the attenuation of out-of-band interference. Changeable rolloff characteristics and frequency cutoff points allow the communication systems to operate over a variety of data rates and channel conditions.

The tasks of filtering and sampling analog signals can be done with various combinations of analog and digital filtering. A common technique is use of a fixed analog filter with the desired frequency characteristics followed by a sampler on the analog filter output sampling at the desired sampling rate. Cost, flexibility, and performance considerations suggest the replacement of analog systems with systems or devices employing digital signal processing (DSP) techniques.

Many systems require the capability of selectively varying sampling rate and bandwidth. A programmable sampling rate as well as a programmable bandwidth can be done in the analog domain or more preferably, in the digital domain. A very common sampling approach is to sample the signal at a rate of four times the bandwidth of the required filter.

Filter realizations involving the use of an analog filter having a variable bandwidth are complex and expensive. Other filter realizations, such as the use of several fixed analog filters and a selection switch to select among them, lack the flexibility of frequency selection and yet require time-consuming and often difficult alignment in the manufacturing process. Digital filters which employ a variable bandwidth using fixed-rate sampling lose the constant factor between the output bandwidth and the output sampling rate, and therefore there is a need to convert the output to an analog waveform and then to re-sample the output at the desired rate. They also can be expensive to implement for very wide ranges of frequency programmability.

The use of half-band digital filters has been proposed for efficient implementations of decimation or interpolation by powers of two. See for example Bellanger et al., "Interpolation, extrapolation, and reduction of computation speed in digital filters," *IEEE Trans. Acoust., Speech, Signal Processing*, vol. ASSP-22, pp. 231–235, August, 1974. Also suggested have been an optimized multistage process for sampling rate reduction or increase. See R. R. Shively, "On multistage FIR filters with decimation," *IEEE Trans. Acoust., Speech, Signal Processing*, vol. ASSP-23, pp. 353–357, August, 1975; and R. E. Crochiere and L. R. Rabiner, "Optimum FIR digital filter implementations for decimation, interpolation, and narrow-band filtering," *IEEE Trans. Acoust., Speech, Signal Processing*, vol. ASSP-23, pp. 444–456, October, 1975.

Half-band digital filters can be realized with a small computational burden as polyphase recursive all-pass subfilters with phase shifts selected to add constructively in the passband and destructively in the stopband. See for example P. A. Regaila, et al., "The digital all-pass filter: a versatile signal processing building block," *Proc. IEEE*, vol. 76, No. 1, January, 1988.

The problem with these digital implementations is that only a small number of sampling rates can be realized.

What is needed is a versatile filter realization with a variable sample clock which minimizes computation burden, expense, and signal quality degradation, while maximizing flexibility.

SUMMARY OF THE INVENTION

According to the invention, a variable digital filter employs a variable rate sample clock with combinations of various digital filter elements such as an efficient implementation of decimation to achieve various filter realizations allowing selectable output bandwidth. More specifically, a digital filter apparatus is coupled to receive input analog signals from a fixed anti-aliasing analog filter and optionally includes one or several stages of digital decimation filters, an optional digital matched filter and an optional equalizer, each of which may be programmed so as to configure the device with a variety of transfer characteristics, including various forms of high-pass, low-pass, equalization or combinations thereof. The filter device employs an input sample clock in the range of F-K*F, where, in a specific embodiment, K is selected to be 2. The selectable combination of elements and stages used to form the filter needed is operative at a broad range of sample rates over a predetermined bandwidth range without loss of resolution.

Another aspect of the invention is an extremely simple digital filter whose bandwidth is ¼ of the input sample rate.

The use of a digital filter according to the invention, as opposed to a conventional analog filter, will result in numerous advantages. There will be improved performance. There will be greater flexibility due to programmability, as it can be easily matched to many transmitters. There will be a reduced cost of manufacturing, as it can be implemented on a single integrated circuit chip. There will be no need for alignment. There will be improvements in the ease of testing, and upgrading will be simplified.

Other advantages and aspects of the invention will be better understood by reference to the following detailed description in connection with the accompanying drawings.

DESCRIPTION OF SPECIFIC EMBODIMENTS

Figure 1:
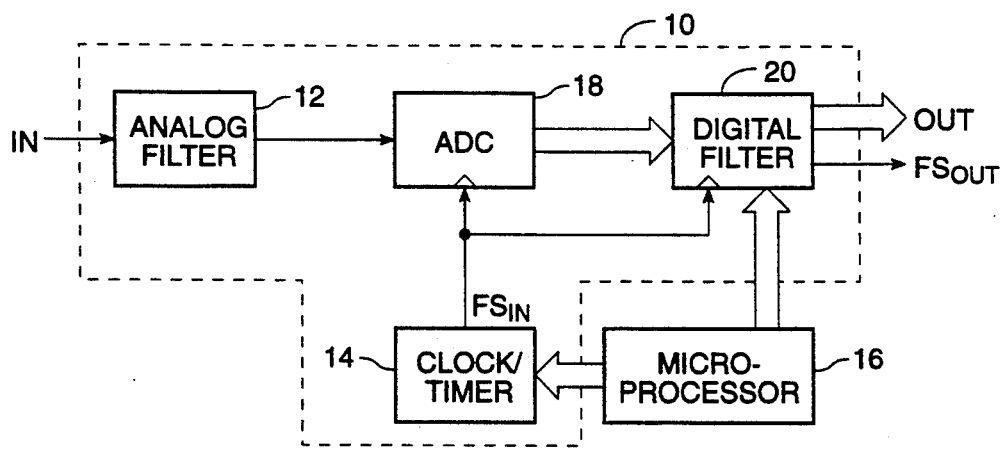
FIG. 1 is a system block diagram for a filter device in accordance with the invention showing interconnection with a microprocessor.

Referring to FIG. 1, there is shown a system block diagram for a filter apparatus 10 in accordance with the invention showing interconnection with a microprocessor 16. The filter apparatus comprises four elements: an analog filter 12, an analog to digital converter (ADC) 18, variable digital filtering means 20, and a clock/timer 14. The analog filter 12 has a bandwidth $F_{CU}$, and it is disposed at the signal input to the ADC 18. The clock/timer 14 may be any controllable variable rate digital clock source. More particularly, the output of the analog filter 12 is sampled at the rate $FS_{IN}$ by an ADC 18 at a rate determined by the clock/timer 14. The samples out of ADC 18 are fed to the variable digital filtering means 20. The digital filtering means 20 is configured for a particular transfer function and may incorporate none, one or several decimation stages as shown hereinafter.

The input sampling rate $FS_{IN}$ is always at least two times the cutoff frequency $F_{CU}$ of the analog filter 12 to avoid potential problems with aliasing. $FS_{IN}$ may be varied over the range $FS_{IN}=2*F_{CU}$ to $2*K_0*F_{CU}$, where $K_0$ is greater than 1. The selection of the output sampling rate $FS_{OUT}$ is done by choosing $FS_{IN}$ from the above range, the number of decimation stages N in the variable digital filtering means, and the amount of decimation in each decimation stage. For example, where $K_0=K$, the number of decimation stages is N, and each decimation stage decimates the clock by K, then $$FS_{OUT}=FS_{IN}/K^N \qquad (1a)$$

In a specific embodiment, K=2 and the input sampling rate range is $2*F_{CU} \leq FS_{IN} \leq 4*F_{CU}$. Each of N decimation stages decimates the sample clock by 2, so $FS_{OUT}$ is related to $FS_{IN}$ by $$FS_{OUT}=FS_{IN}/2^N \qquad (1b)$$

The output sample rate $FS_{OUT}$ can be any value (limited by the resolution of the clock/timer) in the range $2*F_{CU}/2^N$ to $4*F_{CU}$.

Figure 2:
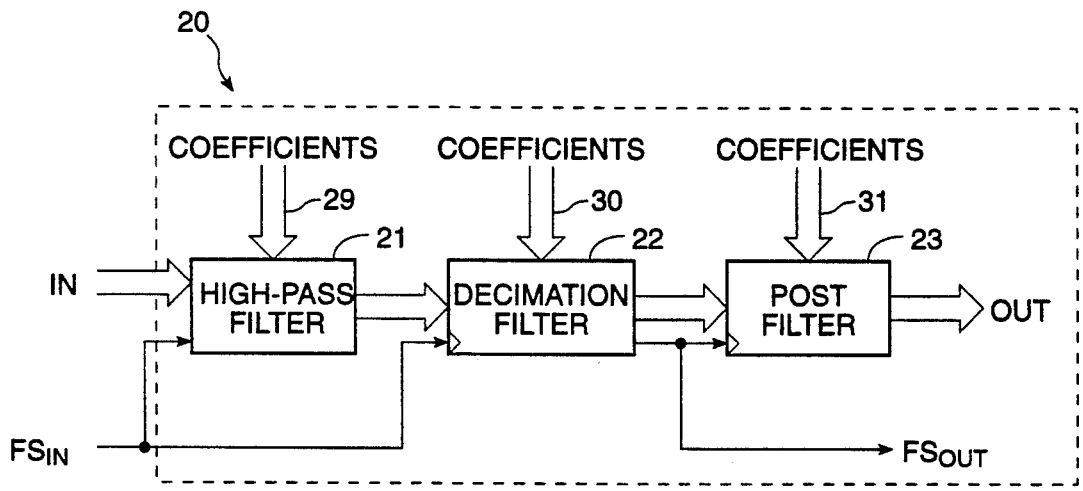
FIG. 2 is a block diagram of the digital filtering means of the device according to the invention showing one arrangement of elements according to the invention.

Referring to FIG. 2, there is shown a block diagram of the variable digital filtering means 20 of the apparatus 10 showing one arrangement of elements according to the invention. There is an optional programmable digital high-pass filter 21 coupled to an optional programmable digital decimation filter 22 coupled to a programmable digital post-filter 23. Various coefficients which tailor the transfer characteristics may be passed to the elements 21, 22, 23 through coefficient inputs 29, 30, and 31 from the microprocessor 16 (FIG. 1). In accordance with well-understood filter design principles, the programmable coefficients of each of the elements 21, 22, and 23 are selected such that the output OUT produces a filtered digital signal which satisfies preselected conditions of a weighted optimization of intersymbol interference, signal-to-noise ratio and adjacent channel rejection. The number of decimation stages is also programmable by the microprocessor such that the value of the output sampling clock $FS_{OUT}$ relative to the input sampling clock $FS_{IN}$ is established. Hereafter, the structure for realizing such a variable filter is explained.

Figure 3:
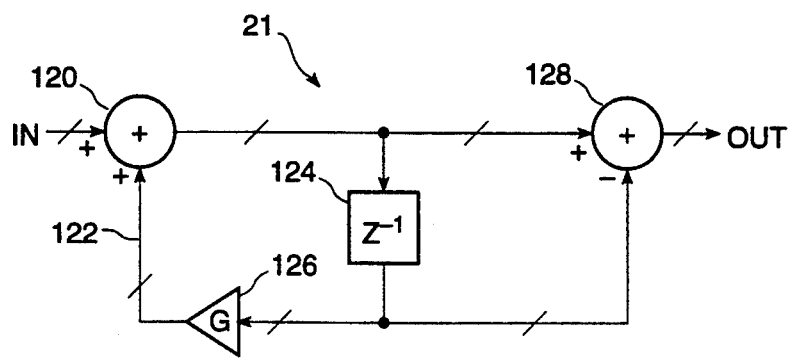
FIG. 3 is a block diagram of a digital high-pass filter.

The optional programmable high-pass filter 21 is used to eliminate any DC that may result from the signal passing through the ADC 18. A specific embodiment of high-pass filter 21 is shown in the block diagram in FIG. 3. A digital adder 120 adds the input sample to a feedback sample 122. The feedback sample 122 is formed by passing the output of adder 120 through a delay 124, and then scaling the output of delay 124 by a programmable value G in scaler 126. The output of delay 124 is also subtracted from the output of adder 120 by adder 128 to produce the desired high-pass filtered signal. Other implementations of digital high-pass filters are well known in the art.

Figure 4:
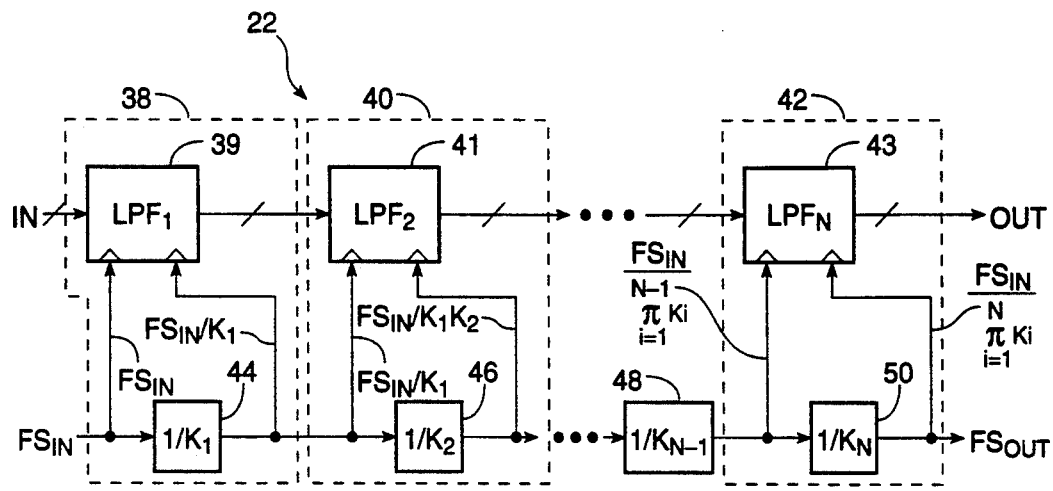
FIG. 4 is a block diagram illustrating a clocking scheme and structure for a decimation filter wherein each stage decimates with a clock whose rate is adjusted by a factor of $K_i$ where i is the number of the corresponding stage.

Referring to FIG. 4, there is shown a multiple stage decimation filter 22 comprising decimation stages 38, 40, 42. Each decimation stage 38, 40, 42 comprises, respectively, low-pass filters 39, 41, 43 with dividers 44, 46, 50. The number of decimation stages is preselectable as previously explained. The first decimation stage 38 is driven at a sample rate $FS_{IN}$. The second decimation stage 40 is driven at a sample rate $FS_{IN}/K_1$, where $K_1$ is the amount of decimation in the first decimation stage 38. Division of the clock by $K_1$ is implemented by a divider 44. Each subsequent divider 46, 48, 50 also divides its received sample clock by $K_i$, where i is the number of the corresponding decimation stage. The last decimation stage is driven by a clock having the clock rate $FS_{IN}$ divided by the product of $K_1$ through $K_{N-1}$. In a specific embodiment where each value of $K_i$ is 2, the last decimation stage is driven by a clock at the rate $FS_{IN}/2^{N-1}$.

The bandwidth of the signal output from each decimation stage is $1/(2*K_i)$ of the clock rate input to that decimation stage. To prevent aliasing, there should be a sharp attenuation of the signal outside of the desired bandwidth.

Figure 5:
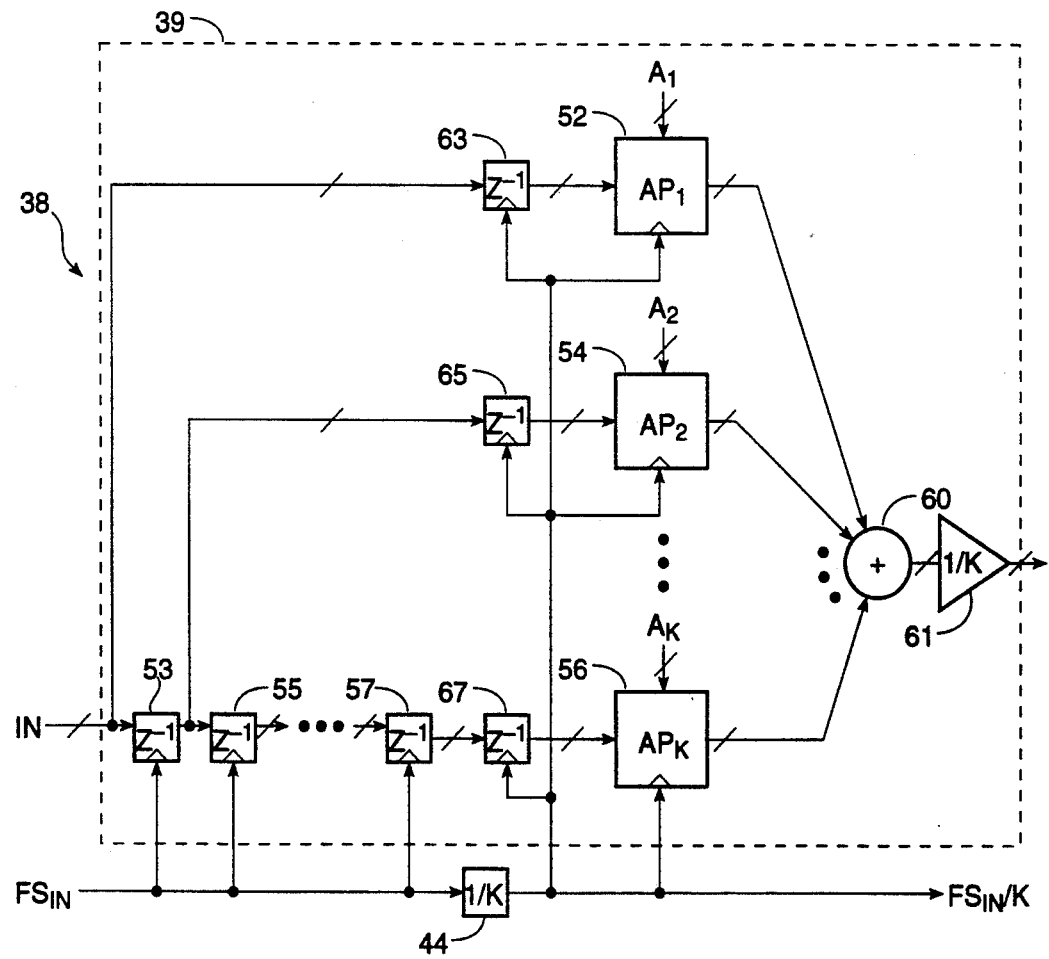
FIG. 5 is a block diagram of a realization of a decimation stage according to the invention wherein there are K all-pass filters in parallel, each of which is characterized by one coefficient.

Referring to FIG. 5, there is shown a block diagram of an exemplary decimation stage 38 according to the invention where $K_1=K$. There are K all-pass filters 52, 54, 56 in parallel, each of which is characterized by one coefficient $A_1, A_2, A_K$. The frequency response of the low-pass filter 39, as well as of all other low-pass filters in the decimation stages, is determined by the combination of the coefficients. The input data is clocked through K−1 digital unit delay elements 53, 55, 57 at the input rate $FS_{IN}$. The output of unit delay elements 53, 55, 57 are input to unit delay elements 63, 65, 67 that act as latches at a rate of $FS_{IN}/K$ which is output from divider 44. Therefore, each all-pass filter 52, 54, 56 receives samples at the output rate $FS_{IN}/K$. Each all-pass filter clocks out its result simultaneously according to the clock out of divider 44. An adder 60 sums the values. The output of the adder 60 is preferably multiplied by 1/K by multiplier 61 for normalization purposes.

Figure 6:
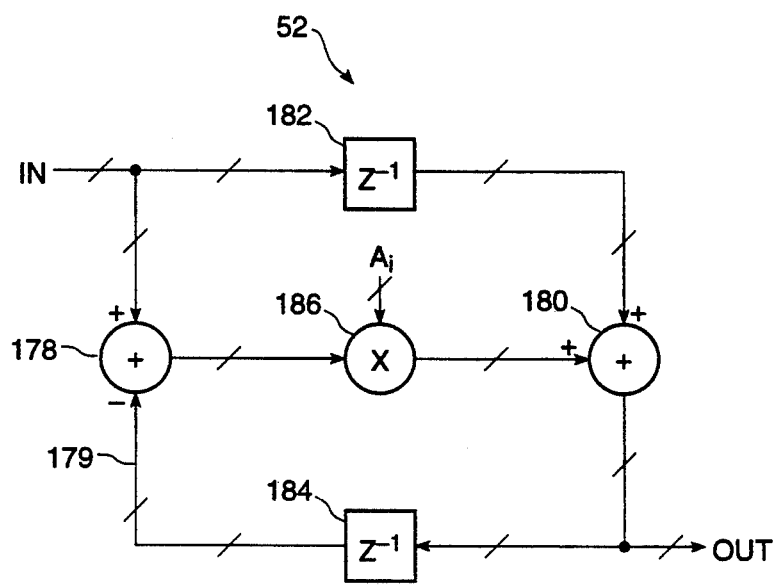
FIG. 6 is a block diagram of an all-pass filter in a decimation stage.

An exemplary all-pass filter 52, 54, or 56 is shown in FIG. 6 comprising two adders 178, 180, two delays 182, 184 and a coefficient multiplier 186. The first adder 178 subtracts feedback signal 179 which is the output delayed by a unit delay by delay 184 from the undelayed input. The coefficient multiplier 186 multiplies the result out of the first adder 178 by the external programmable coefficient $A_i$. The product result of multiplier 186 is summed by second adder 180 with the input delayed by unit delay from delay 182. The sum is the desired output.

Figure 7:
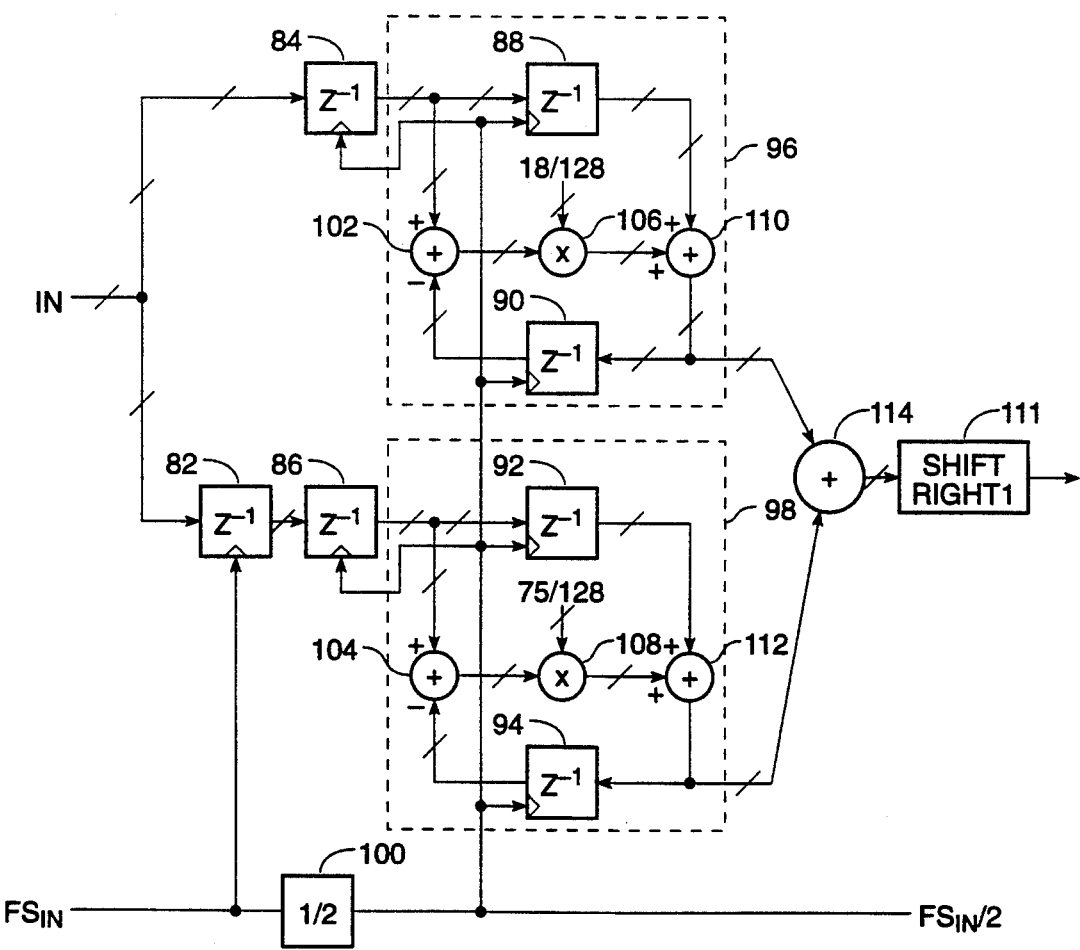
FIG. 7 is a block diagram of a low-pass filter in a decimation stage.

In a specific embodiment, $K_i$ is 2 in each decimation stage. FIG. 7 is a block diagram of an exemplary decimation stage where $K_i=2$. The sample rate out of the decimation stage is half of the input sample rate, and the bandwidth of the output samples are one quarter of the input sample rate. The input data is clocked through a digital unit delay element 82 at the input rate $FS_{IN}$. The delay elements 84, 86, 88, 90, 92, 94 are flip flops operative as single-delay unit shift registers which are responsive to a clock signal to trigger at the rate $FS_{IN}/2$. Delay elements 84 and 86 latch the input data so that every other input sample is clocked into delay element 88 or delay element 92. All-pass filters 96 and 98 receive samples at the output rate $FS_{IN}/2$ which is output from divider 100. Adders 102, 104 subtract outputs delayed by a unit delay by delays 90, 94 from the outputs of delays 84, 86 respectively. The coefficient multipliers 106, 108 multiply the results out of the adders 102, 104 by 18/128 and 75/128 respectively. The product results of multipliers 106, 108 are summed by adders 110, 112 with the input delayed by unit delay from delays 88, 92 respectively. An adder 114 sums the values out of adders 110 and 112. The output of the adder 114 is normalized by a shift right one 111 (a shift toward lesser significant bits).

Figure 8:
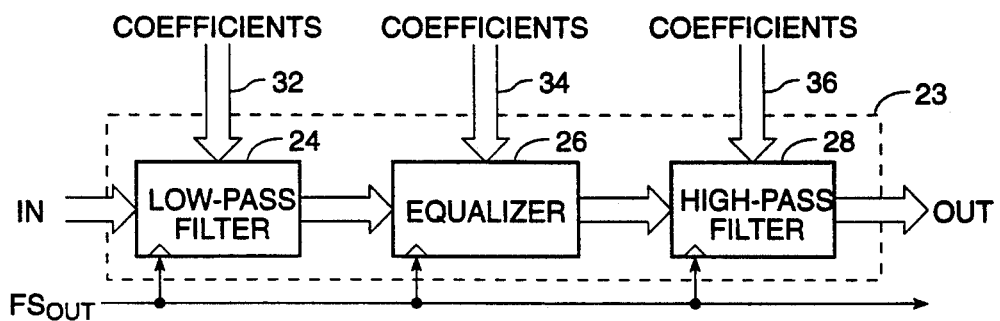
FIG. 8 is a block diagram of a digital post-filter.

FIG. 8 is a block diagram showing one arrangement of post-filter 23. There is a programmable digital low-pass filter 24 coupled to a programmable digital equalizer 26, in turn coupled to a programmable digital high-pass filter 28. The elements and the order of the elements are shown as a specific example. However, all of the elements need not be present, and various orders of the elements may be used. Various coefficients are passed to the elements through coefficient inputs 32, 34, 36 in order to tailor the transfer characteristics of post-filter 23.

Figure 9:
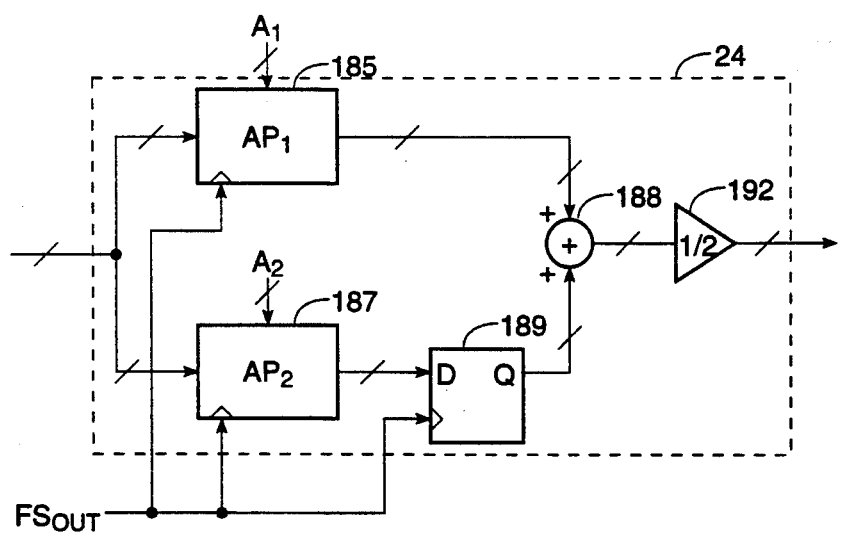
FIG. 9 is a block diagram of a digital low-pass filter in a post-filter.

FIG. 9 is a block diagram of one embodiment of a low-pass filter 24 in a post-filter 23. The low-pass filter 24 comprises two parallel programmable (one-coefficient) all-pass filters 185, 187, a storage register 189, an adder 188, and a divider 192. The frequency response of the programmable low-pass filter 24 is determined by the combination of the two coefficients, $A_1$ and $A_2$. The characteristics of the filter 24 can be selected without structurally altering the filter itself. Samples are input to all-pass filter 185 characterized by coefficient $A_1$ and to all-pass filter 187 characterized by coefficient $A_2$. The output of all-pass filter 187 is delayed by one unit of delay by storage register 189. The output of all-pass filter 185 and storage register 189 are then added by adder 188. The output of adder 188 is divided by two by divider 192 for normalization purposes. Other implementations of digital low-pass filters are well known in the art.

Figure 10:
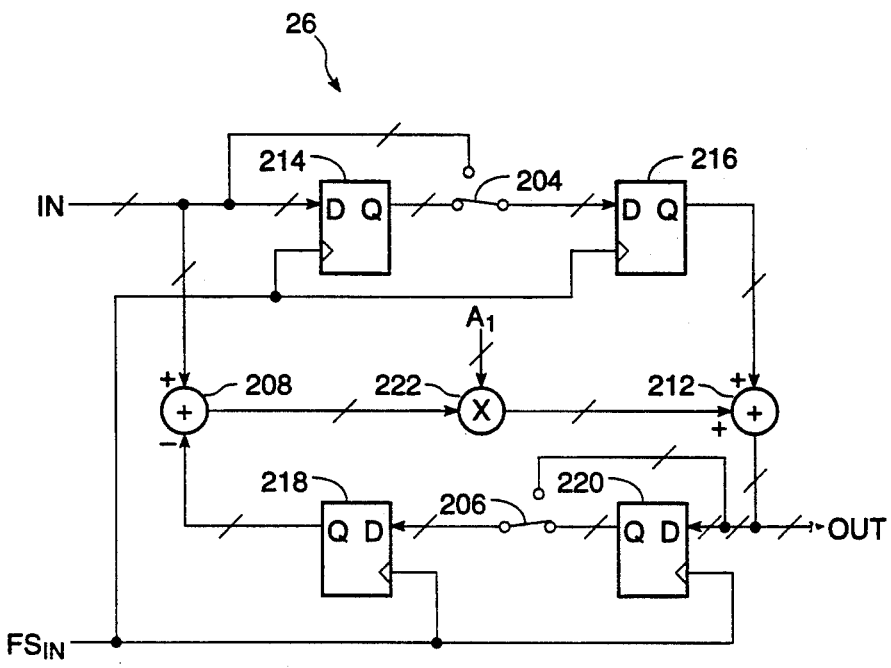
FIG. 10 is a block diagram of a digital equalizer in a post-filter.

FIG. 10 illustrates one embodiment of the equalizer 26 in a post-filter 23. It comprises two adders 208, 212, two sets of two series-connected shift registers 214, 216 and 218, 220 (one in the forward signal path and the other in the reverse signal path), a coefficient multiplier 222, a first switch 204 and a second switch 206. Switches 204 and 206 are programmably opened or closed. The state of the switches 204, 206 and the value of the coefficient $A_i$ determine the response of the equalizer. The first adder 208 subtracts the delayed output from the undelayed input. The output is delayed by one unit of delay by shift register 218 or by two units of delay by shift registers 218 and 220 depending on the state of the externally programmable second switch 206. The coefficient multiplier 222 multiplies the result out of the first adder 208 by the external programmable coefficient $A_i$. The product result of multiplier 222 is summed by second adder 212 with the delayed input. The input is delayed by unit of delay by shift register 214 or by two units of delay by shift registers 214 and 216, depending on the state of the externally programmable first switch 204. The output of second adder 212 is the equalized signal.

In one embodiment, the high-pass filter 28 is exactly the same as high-pass filter 21.

The post-filter 23 according to the invention may be configured in a variety of ways, with various combinations of low-pass, optional equalization and optional high-pass elements in series connection with the optional decimation stages. The result is an extremely flexible structure.

In order to realize the structures, it is also desirable to employ a multiplier which is both simple and fast. By proper selection of filter coefficients it is possible to fabricate a very low complexity multiplier employing only adders and shifters. Filter coefficients can be represented by a Canonic Signed Digit (CSD) code with a small number of nonzero digits.

A number "A" may be represented by a CSD code with two digits as:

$$A = S_1 2^{-K_1} + S_2 2^{-K_2} \quad (3)$$

where $S_1$ and $S_2$ are members of the set $\{-1, 0, +1\}$ and K1 and K2 are positive integers As a result of an optimization process, in a specific embodiment where $K_i=2$, the all-pass filter 96 illustrated in FIG. 7 employs a coefficient having a value 18/128 and the all-pass filter 98 employs a coefficient having a value of 75/128. The coefficient 18/128 is the sum of the values $\frac{1}{8} + 1/64$. Therefore, a multiplier implementing this coefficient and its input can be represented by a set of right shifters and a simple adder in the data path of a data value X. The coefficient 75/128 is the sum and product of the values $(\frac{1}{2}+\frac{1}{8})*(1-1/16)$. Therefore, a multiplier implementing this coefficient and its input can be represented by a set of right shifters, a simple adder and a simple subtractor (negated adder) in the data path of a data value X.

Figure 11:
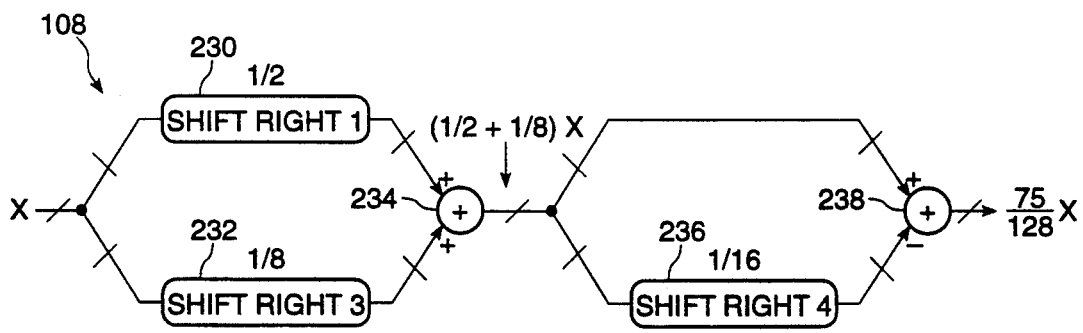
FIG. 11 is a block diagram of a low complexity multiply by 75/128 circuit suitable for use in a low-pass filter in a decimation stage according to the invention.

FIG. 11 illustrates a coefficient multiplier, such as multiplier 108 (FIG. 7), as may be used in the all-pass filter 98 employing the coefficient 75/128. A value X is applied to a one-bit right shifter 230 and to a three-bit right shifter 232 and then summed at an adder 234. The sum is then applied to a four-bit right shifter 236 and then to a negating (subtraction) input of a second adder 238. A fourth register may be provided in parallel to the right shifter 236 as a pass through without shifting, or an equivalent direct coupling may be made so that the sum from adder 234 is applied directly to the adder 238. The product is (75/128)*X, the input multiplied by the desired coefficient.

Figure 12:
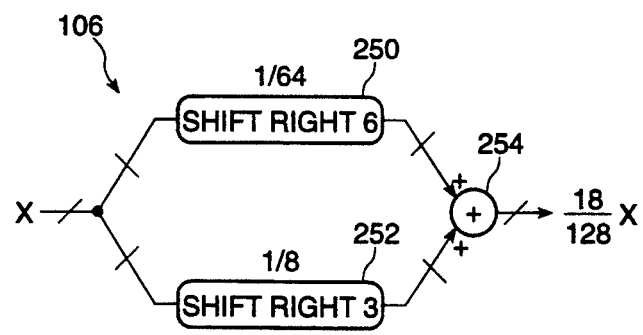
FIG. 12 is a block diagram of a low complexity multiply by 18/128 circuit suitable for use in a low-pass filter in a decimation stage according to the invention.

FIG. 12 illustrates another coefficient multiplier, such as multiplier 106 (FIG. 7), as may be used in the all-pass filter 96 employing the coefficient 18/128. A value X is applied to a six-bit right shifter 250 and to a three-bit right shifter 252 and then summed at an adder 254. The product is (18/128)*X, the input multiplied by the desired coefficient.

It should be understood that the choice of the coefficients is determinative of the characteristics of the filter and of the structure of the multiplier. The multiplier of FIG. 10 is merely illustrative of one structure. The filter structure may be realized employing a plurality of programmable multipliers, each comprising parallel signal paths with programmable shift registers and adders coupled in series. In this manner a fully-programmable variable digital filter may be realized.

The invention has been explained with reference to specific embodiments. Other embodiments will be apparent to those of skill in the art. Therefore, it is not intended that this invention be limited, except as indicated by the appended claims.

What is claimed is:

1. A filter apparatus receiving an input signal, said apparatus comprising:
   means for analog filtering said input signal to produce an analog band-limited signal having a cutoff frequency;
   means for sampling said analog band-limited signal only at a first sampling rate, said first sampling rate being a rate variable relative to the cutoff frequency of said analog filter means, said sampling means being coupled to said analog filtering means to produce a digital sampled signal at said first sampling rate; and
   variable rate digital filtering means coupled at its input to said sampling means for accepting said digital sampled signal at said first sampling rate from said sampling means and filtering said digital sampled signal to produce a filtered output signal at a second sampling rate, wherein the ratio of said first sampling rate to said second sampling rate is variable.

2. The apparatus according to claim 1, wherein said variable rate digital filtering means comprise:
   post-filtering means which is characterized by coefficients which are selected to satisfy preselected conditions.

3. The apparatus according to claim 2 further including:
   a clock means coupled to said sampling means for clocking sampling means at said first sampling rate; and
   a clock divider means coupled at an input to said clock means for dividing said first sampling rate by said ratio to generate said second sampling rate.

4. The apparatus according to claim 2 wherein said post-filtering means comprises:
   a programmable low-pass filter means which satisfy preselected conditions of a weighted optimization of minimum intersymbol interference, best SNR, and maximum adjacent channel rejection.

5. The apparatus according to claim 4 wherein said post-filtering means further comprises:
   a programmable high-pass filter means.

6. The apparatus according to claim 5 wherein said post-filtering means further comprises:
   a programmable equalizer means.

7. The apparatus according to claim 2 wherein the variable rate digital filtering means further comprises at least one decimation stage, wherein each said decimation stage comprises:
   means for decimating received samples by an integer multiple in each said decimation stage; and
   means for bandwidth reduction to produce an output signal from each said decimation stage whose bandwidth has been reduced by a factor of said integer multiple from the input signal to each said decimation stage.

8. The apparatus according to claim 7 wherein said integer multiple in each said decimation stage is 2.

9. The apparatus according to claim 7 wherein said variable rate digital filtering means further comprises:
   high-pass filter means coupled to said sampling means.

10. The apparatus according to claim 7 wherein said bandwidth reduction means comprises:
    said integer multiple number of all-pass filtering means;
    means for delivering said received samples sequentially to said integer multiple of said all-pass filtering means such that each said all-pass filtering means receives one out of every said integer multiple of samples; and
    a first digital summing means for summing the output of all said all-pass filtering means.

11. The apparatus according to claim 10 wherein each said all-pass filtering means comprise:
    means for receiving an input;
    means for supplying an output;
    a first digital delay means coupled to receive said output for delaying said output by a unit of delay;
    a second digital summing means for subtracting output of said first digital delay means from said received input;
    a digital multiplier means coupled to receive second summed data from said second summing means for multiplying said second summed data by a single coefficient;
    a second digital delay means coupled to receive data from said input port for delaying data by a unit of delay; and
    a third digital summing means for summing the output of said second digital delay means with the output of said digital multiplier means to provide said output.

12. The apparatus according to claim 11 wherein said integer multiple in each said decimation stage is 2.

13. The apparatus according to claim 12 wherein said single coefficient in said multiplier of a first all-pass filter is 18/128 and said single coefficient in said multiplier of a second all-pass filter is 75/128.

14. A digital filter apparatus having a bandwidth ¼ of the input sample rate comprising:
    first all-pass filtering means characterized by a first coefficient having a value 18/128 coupled to receive input samples for producing a first output, said first all-pass filtering means comprising:

a first shift register and a second shift register coupled to receive in parallel the input samples as input data, and a first summer which is coupled to receive first shifted data from said first shift register and to receive second shifted data from said second shift register to produce first summed data, said first shift register shifting its input data by six bits right to effect division by 64 at its output as the first shifted data, and said second shift register shifting its input data by three bits right to effect division by 8 at its output as the second shifted data such that the first summed data of said first summer is a product of 18/128 and its input samples;

second all-pass filtering means characterized by a second coefficient having a value 75/128 coupled to receive input samples to produce a second output, said second all-pass filtering means comprising:

a third shift register and a fourth shift register coupled to receive in parallel its input samples as its input data, a second summer which is coupled to receive third shifted data from said third shift register and fourth shifted data from said fourth shift register to produce second summed data, a fifth shift register, and a third summer which is coupled to receive the second summed data from said second summer and fifth shifted data from said fifth shift register, said third shift register shifting its input data by one bit right to effect division by 2 at its output as the third shifted data, and said second shift register shifting its input data by three bits right to effect division by 8 at its output as the fourth shifted data such that the second summed data is a product of ⅝ and the input samples, said fifth shift register shifting its input data by four bits right such that the third summed data is a product of 75/128 and the input samples;

means for delaying said second output of said second all-pass filtering means by one delay unit; and means for adding said first output with the output of said delaying means to produce a filter output.

15. The apparatus according to claim 14 wherein said first all-pass filtering means and said second all-pass filtering means each comprises:
means for receiving a received input;
means for supplying a supplied output;
a first digital delay coupled to receive said supplied output for delaying said supplied output by one unit of delay;
a first digital summing means for subtracting output of said first digital delay from said received input to produce the input samples of the all-pass filtering means; and
a second digital delay means coupled to receive said received input for delaying said received input by one unit of delay.

16. A digital filter apparatus having a bandwidth ¼ of the input sample rate comprising:
first all-pass filtering means characterized by a first coefficient having a value 18/128 coupled to receive input samples for producing a first output, said first all-pass filtering means comprising:

a first shift register and a second shift register coupled to receive in parallel the input samples as input data, and a first summer which is coupled to receive first shifted data from said first shift register and to receive second shifted data from said second shift register to produce first summed data, said first shift register shifting its input data by six bits right to effect division by 64 at its output as the first shifted data, and said second shift register shifting its input data by three bits right to effect division by 8 at its output as the second shifted data such that the first summed data of said first summer is a product of 18/128 and its input samples;

second all-pass filtering means characterized by a second coefficient having a value 75/128 coupled to receive input samples to produce a second output, said second all-pass filtering means comprising:

a third shift register and a fourth shift register coupled to receive in parallel its input samples as its input data, a second summer which is coupled to receive third shifted data from said third shift register and fourth shifted data from said fourth shift register to produce second summed data, a fifth shift register, and a third summer which is coupled to receive the second summed data from said second summer and fifth shifted data rom said fifth shift register, said third shift register shifting its input data by one bit right to effect division by 2 at its output as the third shifted data, and said second shift register shifting its input data by three bits right to effect division by 8 at its output as the fourth shifted data such that the second summed data is a product of ⅝ and the input samples, said fifth shift register shifting its input data by four bits right such that the third summed data is a product of 75/128 and the input samples;

means for delaying said second output of said second all-pass filtering means by one delay unit; and means for adding the first output of said first all-pass filtering means with the second output of said second all-pass filtering means to produce a filter output.

17. A method for filtering an input signal, said method comprising:
analog filtering said input signal to produce an analog band-limited signal having a cutoff frequency;
sampling said analog band-limited signal only at a first sampling rate, said first sampling rate being variable relative to the cutoff frequency of said analog filtering, said sampling means being coupled to said filtering means to produce a digital sampled signal at said first sampling rate;
accepting said digital sampled signal at said first sampling rate; and
digitally filtering said digital sampled signal to produce a filtered output signal at a second sampling rate, wherein the ratio of said first sampling rate to said second sampling rate is variable.

18. The method according to claim 17, wherein said variable rate digital filtering step comprises:
post-filtering with coefficients which are selected to satisfy preselected conditions.

19. The method according to claim 18 wherein the variable rate digital filtering step further comprises decimating with at least one decimation stage, wherein each said decimating step comprises:

decimating received samples by an integer multiple in each said decimation stage; and bandwidth reducing to produce an output signal from each said decimation stage whose bandwidth has been reduced by a factor of said integer multiple from the input signal to each said decimation stage.

* * * * *